(12) United States Patent
Hsu et al.

(10) Patent No.: US 6,437,623 B1
(45) Date of Patent: Aug. 20, 2002

(54) DATA RETENTION REGISTERS

(75) Inventors: Louis L. Hsu, Fishkill; Wei Hwang, Armonk, both of NY (US); Stephen V. Kosonocky, Darien, CT (US); Li-Kong Wang, Montvale, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/782,435

(22) Filed: Feb. 13, 2001

(51) Int. Cl.[7] .............................................. H03K 3/289
(52) U.S. Cl. ...................................... 327/202; 327/203
(58) Field of Search ............................... 327/202, 203, 327/199, 200, 201, 218; 714/726

(56) References Cited

U.S. PATENT DOCUMENTS

| | | | | |
|---|---|---|---|---|
| 4,782,283 A | * | 11/1988 | Zasio ........................... | 327/202 |
| 5,951,702 A | * | 9/1999 | Lim et al. .................... | 714/718 |
| 5,973,529 A | * | 10/1999 | Chappell et al. ............. | 327/200 |
| 6,032,278 A | * | 2/2000 | Parvathala et al. .......... | 714/726 |
| 6,271,700 B1 | * | 8/2001 | Itaya ............................ | 327/202 |

* cited by examiner

Primary Examiner—Tuan T. Lam
(74) Attorney, Agent, or Firm—F. Chau & Associates, LLP

(57) ABSTRACT

A data retention system has master-slave latches for holding data in an active mode; a data retention latch for preserving data read from the master latch in a sleep mode, which is connected to the master latch in parallel with the slave latch; a first multiplexer for receiving data externally provided and feedback data from the data retention latch, and selectively outputting either the data externally provided or the feedback data to the master latch in response to a first control signal; and a second multiplexer for transferring output data of the master latch to the slave latch and the data retention latch in response to a second control signal, wherein power for the data retention latch remains turned on in the sleep mode, while power for the data retention system except for the data retention latch is turned off. The data retention latch may include gate transistors controlled by the second control signal and a data holding unit having transistors for holding data transferred through the gate transistors, wherein the gate transistors and the transistors in the data holding unit have a high-threshold voltage.

18 Claims, 5 Drawing Sheets

DATA RETENTION REGISTERS

BACKGROUND OF THE INVENTION

1. Field of the Invention

The present invention relates to data retention registers in a data processing system, and more particularly, to a data retention latch for preserving data in a power-down mode of the system.

2. Description of the Related Art

In electronic systems, power consumption is one of the factors determining efficiency and functionality of the system. Especially, with the proliferation of wireless and portable electronic devices such as palm top computers, cellular telephones, etc., power consumption has become an important factor to be considered in designing and manufacturing such electronic devices. This is because such electronic devices are typically subject to the limitation of battery lifetime, a duration of usage of a battery or a duration of usage between charges in case of a rechargeable battery. Thus, in battery-operated portable electronic devices as well as other power-saving electronic devices, much effort has been devoted to reduce the power consumption of the devices.

In modern electronic systems, power-saving techniques have been introduced to reduce the power consumption. One power-saving technique is employing a "sleep mode" (or power-down mode). In this technique, while an electronic system is not in active use, the system is rendered into the sleep mode to save the power dissipated in the system. In the sleep mode, no power is theoretically supplied to electronic circuits in the system, except for circuits to which the power is inevitably necessary for a proper operation to bring the device to an active mode following the sleep mode. In other words, the main power for the system may be turned off in the sleep mode, and only selective power lines are maintained for the minimum number of circuits for the proper operation.

The system returns to an active mode from the sleep mode when a user resumes an active use on the system. The transitional state of the system from the sleep mode to the active mode is called a "wake-up" mode.

In order for an electronic system to recover from the sleep mode to the wake-up mode and then to the active mode, some necessary data should remain during the sleep mode in a data storage section of the system. Data retention registers are typically used to preserve such necessary data while the system is in the sleep mode. In the absence of such a process and/or registers for preserving data necessary for returning to the active mode, it will be necessary to reenter the data when the system is recovered to the active mode from the sleep mode.

In the sleep mode, although no switching activity occurs and the selective power lines are maintained to preserve the necessary data, the data retention registers may still lose the data preserved therein due to the leakage current in the circuits of the registers.

To reduce such a risk of losing the data preserved in the data retention registers, high-threshold voltage transistors are employed in the circuits of the registers. This is because the leakage current in the high-threshold voltage transistors is much smaller than that in transistors with the normal threshold voltage, although the high-threshold voltage transistors are not able to provide the same speed as the normal threshold voltage transistors from a reduced overdrive voltage.

Referring to FIG. 1, there is provided a circuit diagram of a conventional data retention system 10. The data retention system 10 has master-slave latches 12, 14 which are commonly used for storing data. The master-slave latches 12, 14 hold data provided through an input terminal IN, and output the held data through an output terminal OUT. The data retention system 10 also has a "balloon" circuit 16 connected to the master-salve latches 12, 14. The balloon circuit 16 preserves the data which are held in the master-slave latches 12, 14 in a sleep mode (i.e., power-down mode). The balloon circuit 16 has input and output terminals Si, SO for receiving and generating data, respectively. When the data retention system 10 (or an entire data processing system including the data retention system 10) is rendered into the sleep mode, a power supply (not shown) for the system including the master-slave latches 12, 14 is turned off so that the master-slave latches 12, 14 receive substantially no power, i.e., substantially zero (0) supply voltage. On the other hand, the balloon circuit 16 continuously receives a predetermined supply voltage in the sleep mode as well as the active mode from an independent power supply (not shown). As a result, the balloon circuit 16 can preserve the data read from the master-slave latches 12, 14 during the sleep mode.

As shown in FIG. 1, the balloon circuit 16 is completely paralleled with the master-slave latches 12, 14. In other words, the balloon circuit 16 has substantially identical elements and configuration as those of the master-slave latches 12, 14. Only difference between the balloon circuit 16 and the master-slave latches 12, 14 is that the balloon circuit 16 employs high-threshold voltage transistors. This is because by using the high-threshold voltage transistors data preserved in the balloon circuit 16 can be prevented from being lost due to a leakage current.

The balloon circuit 16, for example, includes a pass gate transistor TG which separates the balloon circuit 16 from the master-slave latches 12, 14. Since the pass gate transistor TG has a high-threshold voltage, the leakage current in the balloon circuit 16 is cut off by turning off the pass gate transistor TG.

In the sleep mode, under the control of sleep mode clock signals SL1, SL2, the balloon circuit 16 remains active to preserve the data read from the master-slave latches 12, 14, and the pass gate transistor TG is turned off to prevent the leakage current, while the master-slave latches 12, 14 are inactive. When the system 10 is recovered to the active mode, the master-slave latches 12, 14 become active and the data preserved in the balloon circuit 16 is loaded into the master-slave latches 12, 14. Examples of data retention registers are disclosed, for example, in "A 1-V High-Speed MTCMOS Circuit Scheme for Power-Down Application Circuits", by S. Shigematsu et al., June 1997, IEEE Journal of Solid-State Circuits, Vol. 32, No. 61 , pp. 861–869, whose disclosures are herein incorporated by reference.

However, since a conventional data retention circuit (e.g., the balloon circuit) is completely paralleled with corresponding master-slave latches as described above, the data retention circuit should have the substantially identical number of transistors as those in the master-slave latches. Such a structure amounts to a hindrance factor in improving the integration density of the circuits.

In addition, the conventional data retention circuit employs the high-threshold voltage transistors to prevent the preserved data from being lost due to the leakage current. As well known to those skilled in this art, high-threshold voltage transistors may cause the data processing system degraded, such as causing a decrease in data read/write speed in a data storage device.

Further, it is necessary to provide an independent power supply for the data retention circuit to preserve data in the sleep mode. The independent power supply should continuously provide a supply voltage to the data retention circuit independent of the status of a main power supply for the system.

Therefore, a need exists for a data retention circuit for preserving data in a sleep mode without degrading the performance of the system. It is desired that a data retention circuit has a simpler design so as to improve the integration density of the circuits. It would be also advantageous to provide a data retention circuit for preserving data in a sleep mode without requiring a supply voltage from an independent power supply.

OBJECTS AND SUMMARY OF THE INVENTION

It is an object of the present invention to provide a data retention system for preserving data in a sleep mode (or a power-down mode) without affecting the performance of a data processing system associated with the data retention system.

It is another object of the present invention to provide a data retention system for preserving data in a sleep mode which can minimize the performance loss, primarily, due to employing high-threshold voltage transistors.

It is still another object of the present invention to provide a data retention circuit having a fewer number of transistors so as to have a simpler design and to improve the integration density of the circuit.

It is further object of the present invention to provide a data retention system for preserving data in a sleep mode without receiving any supply voltage.

To achieve the above and other objects, the present invention provides a data retention system having master and slave latches for holding data in an active mode; a data retention latch for preserving data read from the master latch in a sleep mode, which is connected to the master latch in parallel with the slave latch; a first multiplexer for receiving data externally provided and feedback data from the data retention latch, the first multiplexer selectively outputting either the data externally provided or the feedback data to the master latch in response to a first control signal; and a second multiplexer for transferring output data of the master latch to the slave latch and the data retention latch in response to a second control signal. Preferably, the data retention latch receives a supply voltage in the sleep mode, and the data retention system except for the data retention latch receives no supply voltage in the sleep mode. The first and second control signals may turn off power for the master and slave latches, respectively, in the sleep mode.

The data retention latch preferably inputs and outputs data through a dual rail for carrying true and complementary signals, wherein the true signal is transferred to the slave latch and the complementary signal is transferred to the data retention latch in the active mode, and the true and complementary signals are transferred to the data retention latch in the sleep mode.

The data retention latch preferably includes at least one gate transistor gated by the second control signal, and a data holding unit having transistors for holding data transferred through the at least one gate transistor, wherein the at least one gate transistor and the transistors in the data holding unit have a high-threshold voltage. The data holding unit is preferably connected with the dual rail through which the data preserved in the data holding unit is transferred to the master latch when the data retention system becomes in the active mode.

There is also provided in accordance with a preferred embodiment of the present invention a data retention system having master and slave latches for holding data in an active mode, a data retention and scan latch for preserving data read from the master latch in a sleep mode and for scanning data in the master latch in a testing mode, wherein the data retention and scan latch is connected to the master latch in parallel with the slave latch. Preferably, power for the data retention and scan latch remains turned on in the sleep mode, and power for the data retention system except for the data retention and scan latch is turned off in the sleep mode.

The data retention system may further include a first multiplexer for receiving data externally provided and feedback data from the data retention and scan latch, wherein the first multiplexer selectively outputs either the data externally provided or the feedback data to the master latch in response to a first control signal; and a second multiplexer for transferring output data of the master latch to the slave latch and the data retention and scan latch in response to a second control signal. The data retention and scan latch preferably inputs and outputs data through a dual rail for carrying true and complementary signals.

These and other objects, features and advantages of the present invention will become apparent from the following detailed description of the preferred embodiments thereof, which is to be read in conjunction with the accompanying drawings, wherein like elements are designated by identical reference numbers throughout the several views.

BRIEF DESCRIPTION OF THE DRAWINGS

This disclosure will present in detail the following description of preferred embodiment with reference to the following figures wherein.

DESCRIPTION OF PREFERRED EMBODIMENTS

Detailed illustrative embodiments of the present invention are disclosed herein. However, specific structural and functional details disclosed herein are merely representative for purposes of describing preferred embodiments of the present invention.

Figure 2:
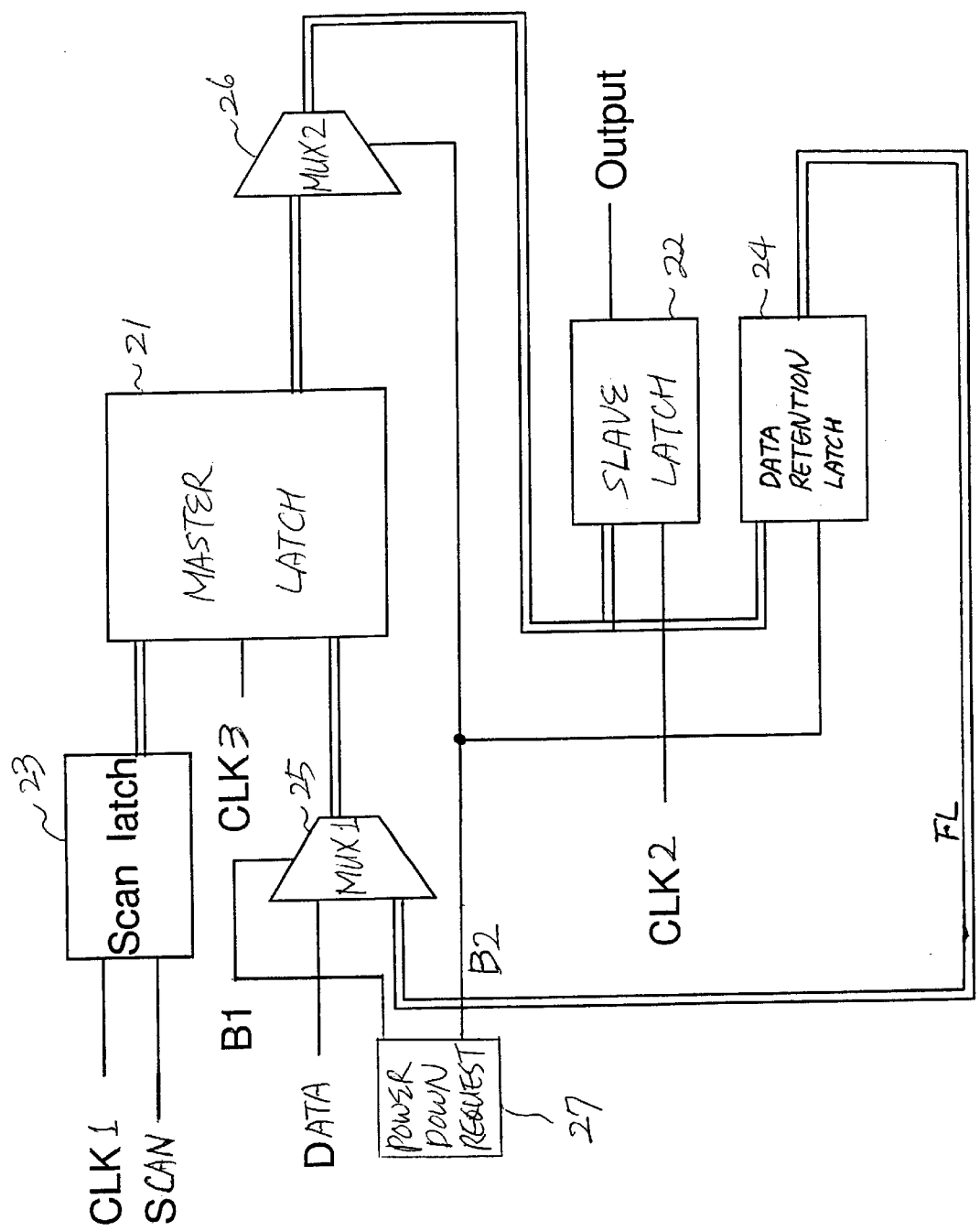
FIG. 2 is a block diagram depicting a preferred embodiment of a data retention system according to the present invention.

Referring to FIG. 2, there is provided a preferred embodiment of a data retention system according to the present invention. In FIG. 2, a master latch 21 and a slave latch 22 are provided to hold data in a like manner as typical master-slave latches do. A scan latch 23 connected to the master latch 21 is also a typical scan latch for scanning data during a test period. A data retention latch 24 is added to the master-slave latches 21, 22, for preserving data in a sleep mode.

The data retention system also includes two multiplexers 25, 26. A first multiplexer 25 is connected between the master latch 21 and the data retention latch 24, and a second multiplexer 26 is connected between the master latch 21 and the slave latch 22 or the data retention latch 24. The first multiplexer 25 multiplexes input data in response to a control signal B1 and generates output data to the master latch 21. The second multiplexer 26 multiplexes input data from the master latch 21 in response to a control signal B2 and generates output data to the slave latch 22 and the data retention latch 24.

A feedback loop FL is provided from the data retention latch 24 to the master latch 21 through the first multiplexer 25. Data preserved in the data retention latch 24 in a sleep mode is transferred to the master latch 21 through the feedback loop in a wake-up mode (this will be explained in detail). The slave latch 22 and the data retention latch 24 are connected to the master latch 21 and arranged in parallel with each other. Thus, data output from the mater latch 21 is transferred via the second multiplexer 26 to both the slave latch 22 and the data retention latch 24. Preferably, the data retention latch 24 has the substantially same structure as that of the slave latch 22, except that the data retention latch 24 employs transistors having a high-threshold voltage.

In the data retention system in FIG. 2, data transmission among the latches, for example, between the first master latch 21 and the slave latch 22 or the data retention latch 24, is implemented by using a "dual rail" which has two data lines for transferring true and complementary signals, respectively. The dual rail is preferably the same data line as a pair of true and complementary bit lines used in a memory array.

By employing the dual rail for data transmission between the latches, data read/write operation with respect to the latches can be performed at higher speed. The use of the dual rail also provides other advantages such as better noise tolerance and balance of data loading. Since the true and complementary data lines of the dual rail carry opposite signals and switching transfers the charges between the lines, the dual rail provides improved noise tolerance.

Such improvements owing to the dual rail in the data transmission and read/write operation can compensate for and minimize the performance loss, primarily, due to the use of the high-threshold voltage transistors in the data retention latch 24. A detailed description of the operation of the data retention system in FIG. 2 follows.

The data retention system in FIG. 2 receives clock signals CLK1, CLK2, CLK3 to provide operational clock pulses to the circuits, a scan signal SCAN for controlling data scan performed in the scan latch 23, and sleep mode control signals B1, B2 having pulses to control the data holding and retention performed in the latches. The sleep mode control signals B1, B2 may be provided from a power-down request unit 27 which generates the control signals B1, B2. according to an operation mode (e.g., active mode or sleep mode) of the system. The first clock signal CLK1 is preferably used to control the mode of the system. For example, the first clock signal CLK1 is logic high in the active mode and becomes and remains logic low during the sleep mode. The second and third clock signals CLK2, CLK3 are standard clock signals for the master-slave latches 21, 22 to perform data input/output. The second and third clock signals CLK2, CLK3 are preferably reverse to each other.

In the active mode, the sleep mode control signals B1, B2 are inactive so that the first and second multiplexers 25, 26 multiplex input signals to perform the normal operation. In other words, the master and slave latches 21, 22 perform the data holding operation as typical master-slave latches do. During the active mode, the master latch 21 holds data sequentially provided from the first multiplexer 25 and provides data held therein to both the slave latch 22 and the data retention latch 24 through the second multiplexer 26. The slave latch 22 and the data retention latch 24 are arranged in parallel to each other. The scan latch 23 scans the data held in the master latch 21 in a test mode under control of the scan signal SCAN. The operation and structure of the master-slave latches 21, 22 and the scan latch 23 are similar to those of conventional master-slave and scan latches, thus a detailed description thereof is omitted.

Since the data held in the master latch 21 is provided via the dual rail to the slave latch 22 and the data retention latch 24, the data retention latch 24 and the slave latch 22 can store the same data read from the master latch 21 during the normal operation (i.e., in the active mode).

When the system enters into the sleep mode, the power-down request unit 27 generates (or activates) the sleep mode control signals B1, B2 to control data flow within the circuits. The first sleep mode control signal B1 controls the power for the master latch 21 through the first multiplexer 25 such that the power for the master latch 21 is turned off during the sleep mode. The second sleep mode control signal B2 controls the power for the slave latch 22 through the second multiplexer 26 such that the power for the slave latch 22 is turned off during the sleep mode.

Since the master and slave latches 21, 22 preferably receive a supply voltage from the same power supply (not shown), the master and slave latches 21, 22 can be closed down simultaneously by turning off the power supply using either the first or second sleep mode control signal B1, B2.

At the same time, the second sleep mode control signal B2 is provided to the data retention latch 24. Under the control of the second sleep mode control signal B2, the data retention latch 24 remains active, i.e., turned on, in the sleep mode. Thus, the data transferred from the master latch 21 at the last moment of the preceding active mode is preserved in the data retention latch 24 while the master-slave latches 21, 22 are in the sleep mode (i.e., receiving substantially zero (0) supply voltage).

Since the data retention system of the present invention employs the dual rail having two data lines, one carrying true signal and the other carrying complementary signal, the second multiplexer 26 multiplexes the true and complementary data lines in response to the second sleep mode control signal B2. Preferably, in the normal operation the true and complementary signals are provided from the master latch 21 to the slave latch 22 and the data detention latch 24, respectively. At the time the sleep mode is signaled, the second multiplexer 26 provides the true and complementary signals to the data retention latch 24. By employing the dual rail of which data lines are switched (or multiplexed ) in such a manner in the active and sleep modes, the data loading at the output of the master latch 21 is not affected by the power-down or -up of the system.

For the data retention latch 24 to remain active in the sleep mode, it would be necessary to provide a power supply independent of the main power supply for the system. However, the data retention latch 24 may preserve the data without requiring the independent power supply by using nonvolatile registers for holding the data in the sleep mode. This is further described below.

When the system mode is changed from the sleep mode to the active mode (i.e., a wake-up mode), the clock signals CLK1–CLK3 are activated and the sleep mode control signals B1, B2 become inactive. When the sleep mode control signals B1, B2 are inactive, the power for the master and slave latches 21, 22 is turned on. At the same time, the second sleep mode control signal B2 controls the data retention latch 24 to send the data preserved therein to the master latch 21. Thus, in the wake-up mode, the master latch 21 receives the data preserved in the data retention latch 24, which is the same data as the master latch 21 transferred to the slave latch 22 and the data retention latch 24 at the last moment of the last active mode (or the beginning of the preceding sleep mode). The data retention system provides the feedback loop FL for transferring the data from the data retention latch 24 to the master latch 21. The feedback loop FL is preferably implemented by the dual rail having the true and complementary data lines.

Figure 3:
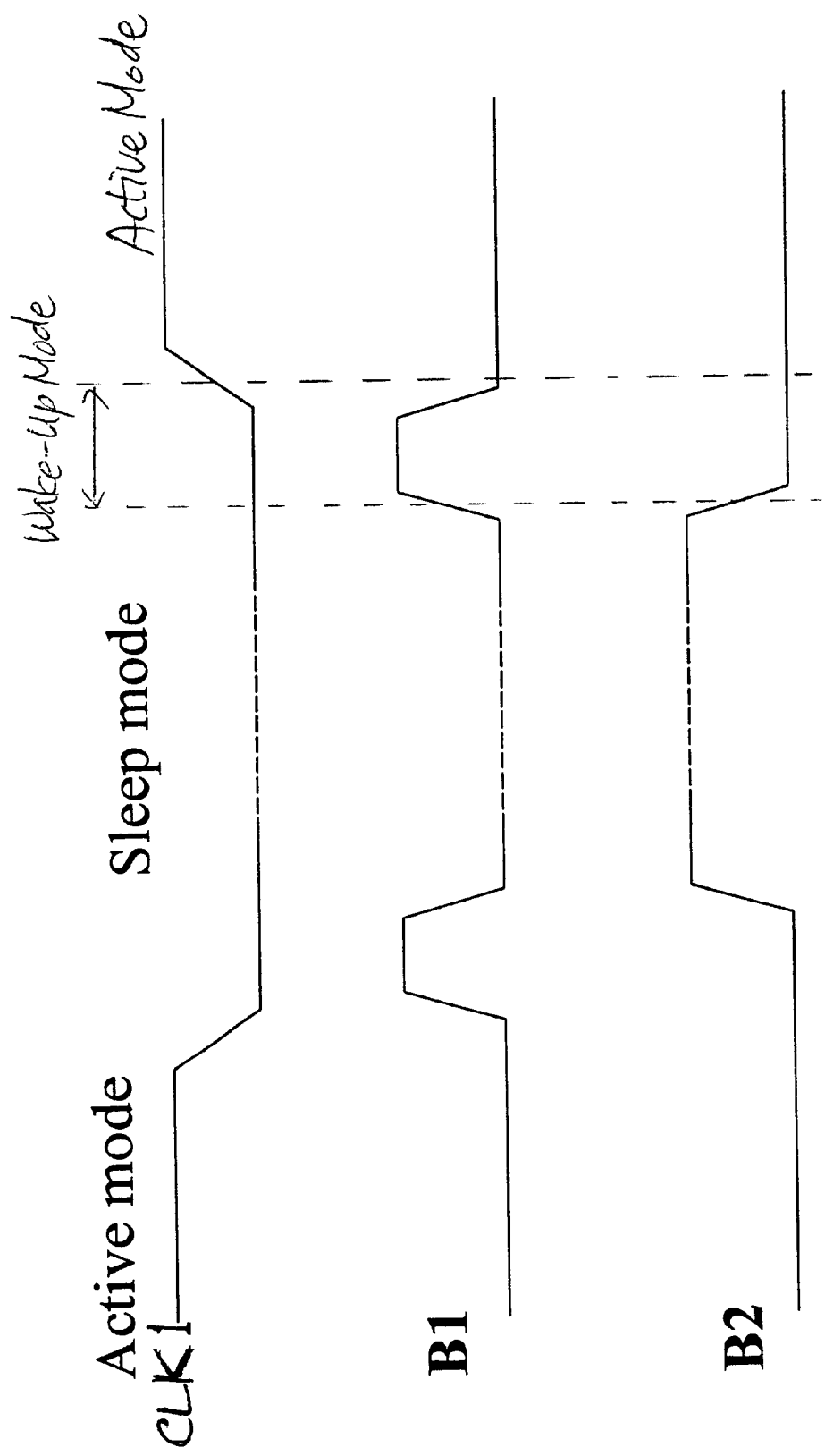
FIG. 3 is a timing diagram showing the clock and control signals in the data retention system in FIG. 2.

Referring to FIG. 3, there is provided a timing diagram for illustrating the first clock signal CLK1 and the sleep mode control signals B1, B2 in the active and sleep modes. The timing diagram in FIG. 3 will be described with reference to the system in FIG. 2. The first clock signal CLK1 is, for example, logic high in the active mode and becomes logic low when the sleep mode is signaled. The first sleep mode control signal B1 provides a control pulse to the first multiplexer 25 at each transition from the active mode to the sleep mode or vice versa. The second sleep mode control signal B2 is activated (e.g., logic high) in the sleep mode.

When the system is changed from the active mode to the sleep mode, the clock signal CLK1 becomes inactive (e.g., logic low), and the first sleep mode control signal B1 is triggered to produce a control pulse (i.e., logic high pulse). The control pulse is provided to the first multiplexer 25 to turn off the power for the master latch 21. At the same time, the second sleep mode control signal B2 is triggered to an active state (i.e., logic high) to turn off the power for the slave latch 22 but allow the data retention latch 24 to remain turned on.

Since only the power for the data retention latch 24 is turned on during the sleep mode, the data can be preserved during the sleep mode using the minimum power consumption. Thus, the power consumption for the system can be minimized.

In the wake-up mode (i.e., the transition from the sleep mode to the active mode), the first sleep mode control signal B1 is triggered to provide a control pulse to turn on the power for the master latch 21, and the second sleep mode control signal B2 is triggered to logic low to turn on the power for the slave latch 22. At the same time, the second sleep mode control signal B2 controls the data retention latch 24 to transfer the data preserved therein to the master latch 21 via the feedback loop FL.

Figure 4:
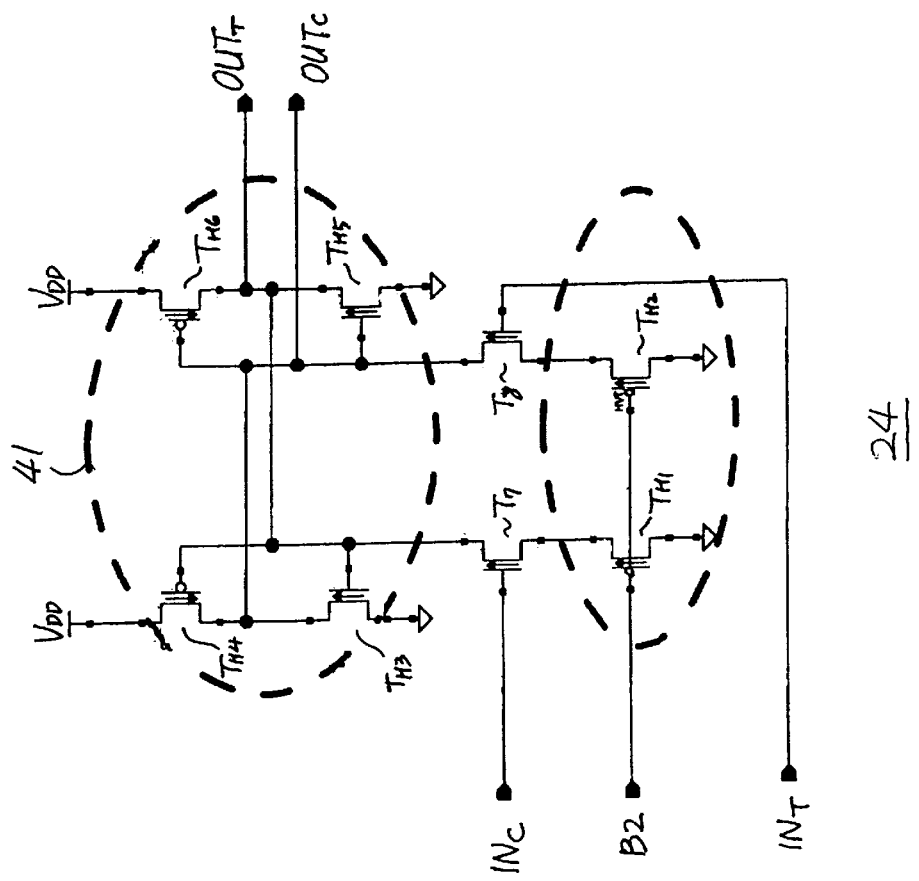
FIG. 4 is a circuit diagram depicting a preferred embodiment of the data retention latch in FIG. 2.

Referring to FIG. 4, there is provided a circuit diagram depicting a preferred embodiment of the data retention latch 24 in FIG. 2. The data retention latch 24 preferably employs high-threshold voltage transistors of which characteristics are known to have low leakage current. By employing the high-threshold voltage transistors, the leakage current in the data retention latch 24 can be substantially reduced. Such a suppression of the leakage current can prevent the data preserved in the data retention latch 24 during the sleep mode from being lost due to the leakage current that otherwise would have flowed in the data retention latch 24.

Figure 1:
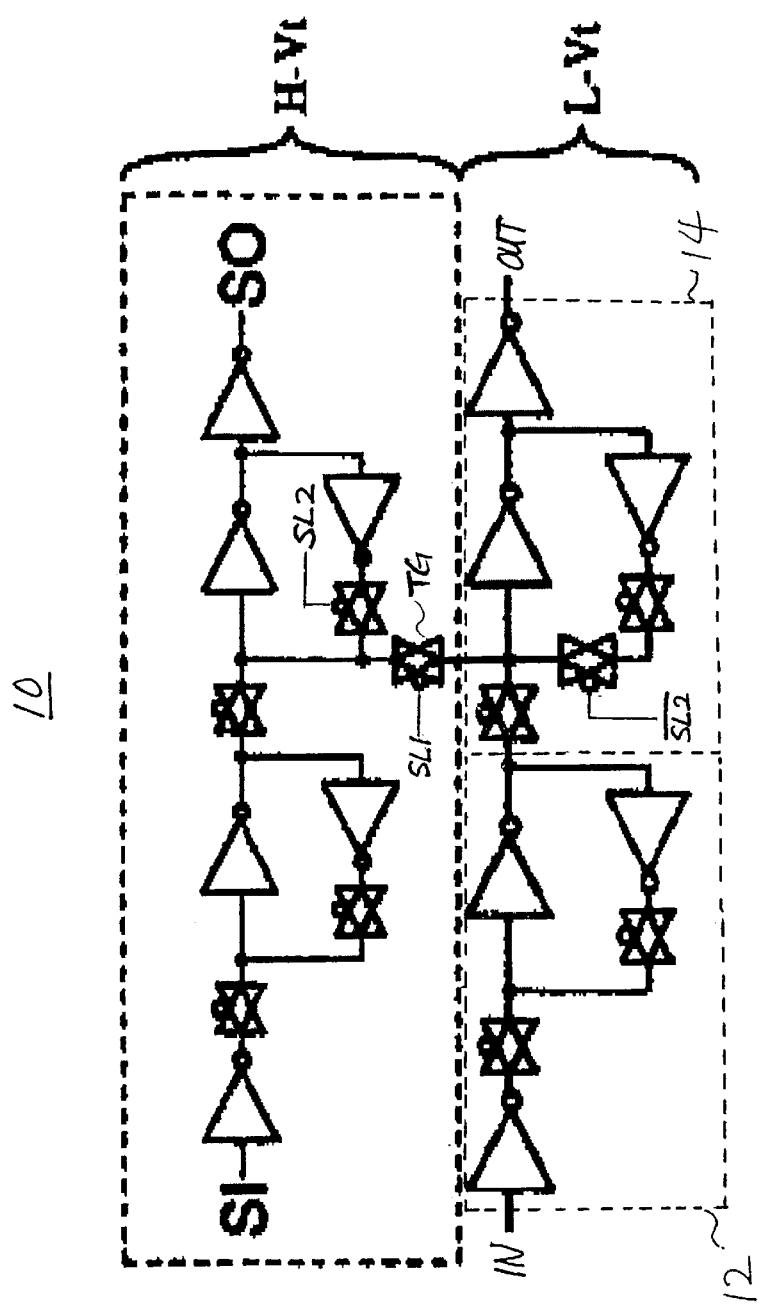
FIG. 1 is a circuit diagram depicting a conventional data retention system.

The data retention latch 24 in FIG. 4 has simpler design (e.g., fewer transistors) than that of conventional data detention registers such as the balloon circuit in FIG. 1. The data retention latch 24 is also connected to the dual rail with true and complementary lines for transferring data from/to the data retention latch 24. The performance of the data retention system of the present invention can be improved by employing the data retention latch 24 with the simpler design as well as the dual rail for the data transfer. A detailed description of operation and structure of the data retention latch 24 follows.

The data retention latch 24 is connected to an input dual rail (i.e., a true input line $IN_T$ and a complementary input line $IN_C$) and an output dual rail (i.e., a true output line $OUT_T$ and a complementary output line $OUT_C$). The second sleep mode control signal B2 is provided to transistors $T_{H1}$, $T_{H2}$, which are gate transistors having a high-threshold voltage. The gate transistors $T_{H1}$, $T_{H2}$ are controlled by the second sleep mode control signal B2. In the active mode, the gate transistors $T_{H1}$, $T_{H2}$ are turned on by the second sleep mode control signal B2 so that the data retention latch 24 receives and holds the data transferred from the master latch via the input dual rail $IN_T$, $IN_C$. The input data are held by a data holding unit 41 having high-threshold voltage transistors $TH_3$, $T_{H4}$, $T_{H5}$, $T_{H6}$.

In the sleep mode, the gate transistors $T_{H1}$, $T_{H2}$ are turned off by the second sleep mode control signal B2 so that the data held in the data holding unit ($T_{H3}$–$T_{H6}$) are preserved in the data retention latch 24 during the sleep mode.

The data retention system of the present invention may also employ a nonvolatile data retention unit as an alternative to the data retention latch 24. The nonvolatile data retention unit can preserve data during the sleep mode without requiring any supply voltage owing to its nonvolatile characteristic. The nonvolatile data retention unit may be implemented by a nonvolatile memory such as nonvolatile SRAM or nonvolatile DRAM. Since such a nonvolatile memory can store data without being affected by the absence of a power supply, the memory can preserve the data during the sleep mode without any independent power supply so that the power consumption of the system can be reduced. The data retention latch 24 may also be replaced with a flash memory such as a flash RAM.

The nonvolatile data retention unit may be implemented, for example, by an electrically erasable and programmable read-only memory (EEPROM) which replaces the data retention unit 24 in FIG. 2. The EEPROM is connected to the master latch 21 via the dual rail and the second multiplexer 26. Data are transferred from the master latch 21 to a pair of EEPROM cells through the two data lines (i.e., true and complementary signals) of the dual rail. When the sleep mode is signaled so that the sleep mode control signal B2 is activated, the data read from the master latch 21 is transferred to and stored in the EEPROM in such a way that true and complementary data are written into a pair of EEPROM cells. Due to the nonvolatile characteristics of the EEPROM, the data can be stored without any power supply in the sleep mode. In the wake-up mode, the data stored in the EEPROM is read and transferred to the master latch 21 through the feedback loop circuit.

Figure 5:
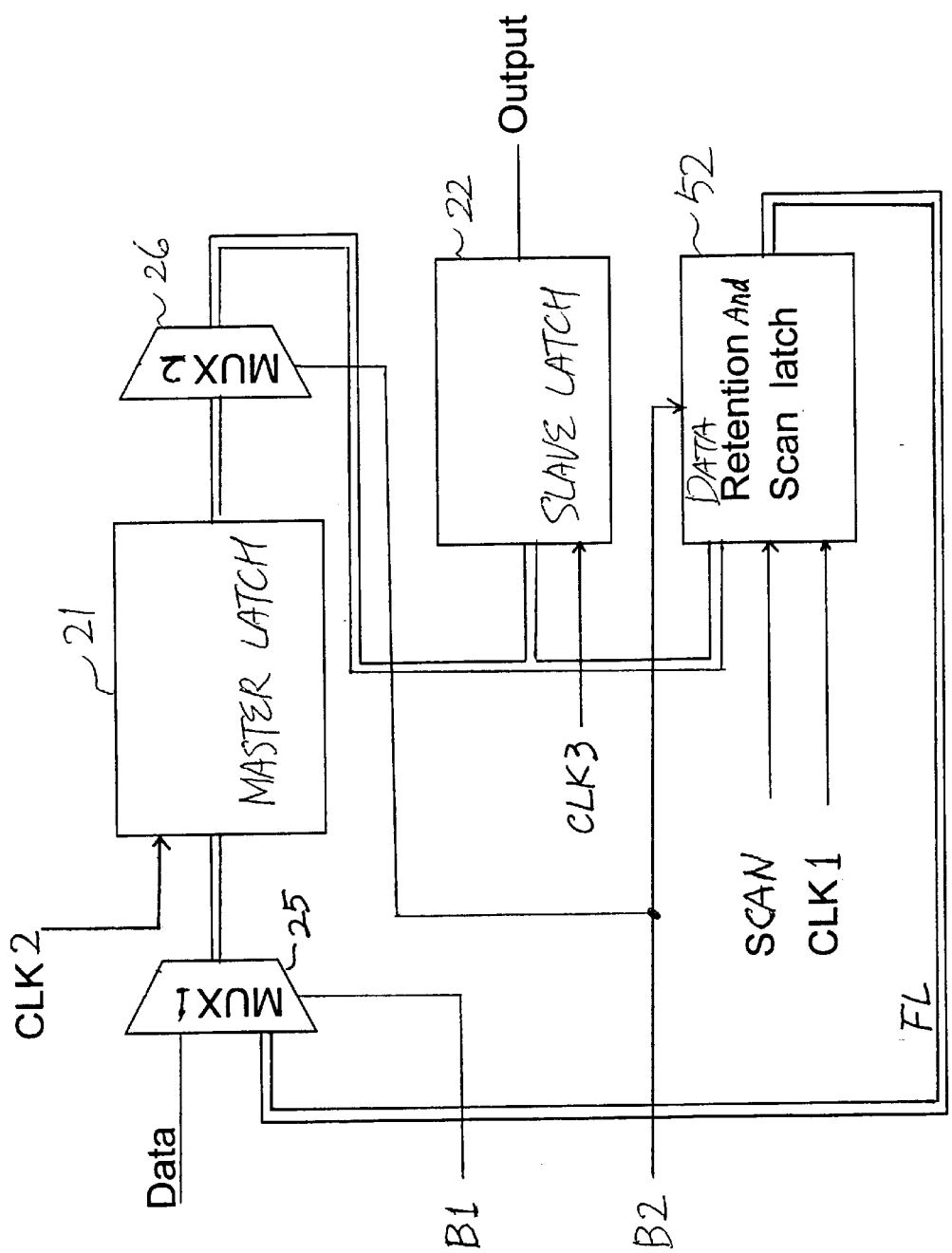
FIG. 5 is a block diagram depicting another preferred embodiment of the data retention system according to the present invention.

Referring to FIG. 5, there is provided a block diagram of another preferred embodiment of the data retention system according to the present invention. In the data retention system in FIG. 5, the master and slave latches 21, 22 and the first and second multiplexers 25, 26 are the same as those in the FIG. 2, thus a detailed description thereof is omitted.

The data retention system in FIG. 5 includes a data retention and scan latch 52 which can perform data scan in a test mode and data retention in the sleep mode. The operation of the data retention and scan latch 52 would be considered as a combination of those of the scan latch 23 and the data retention latch 24 in FIG. 2.

Generally logic circuitry is divided into multiple logic stages, and data processed in each logic stage is stored in data retention registers at the end of each clock cycle. The processed data are usually subject to not only data storing process but also data testing process. Thus, it will advantageous that the data retention registers are used for a data diagnosis purpose as well as preserving the processed data.

Compared with the data retention system in FIG. 2 where the scan latch 23 is used only for scanning data in a test mode and a data retention latch 24 is used only for holding data in the sleep mode, the data retention and scan latch 52 can perform both the data scan and data holding under the control of the scan signal SCAN and the second sleep mode control signal B2. The data retention and scan latch 52 may have the same structure as that of the scan latch 23 in FIG. 2, serving as a "dual purpose" (i.e., scan and retention) latch. Since the data scan as well as the data retention in the sleep mode does not require high-speed performance, the data retention and scan latch 52 can be constructed with high-threshold voltage transistors so that the leakage current in the latch 52 can be substantially reduced.

The scan signal SCAN and the second sleep mode control signal B2 control the operation of the data retention and scan latch 52. When the scan signal SCAN is activated, the data retention and scan latch 52 performs the data scan with respect to the data transferred from the master latch 21 and held in the latch 52. In the test mode, the data are scanned at various testing points to check the correctness of the data at each point. Since such a data scan process is performed slowly (e.g., about 10 MHz), the high-threshold voltage transistors employed in the data retention and scan latch do not affect the data scan process.

When the second sleep mode control signal B2 is activated in the sleep mode, the data retention and scan latch 52 preserves the data transferred from the master latch 21. The data retention and scan latch 52 transfers the preserved data to the master latch 21 when the second sleep mode control signal B2 becomes inactive in the wake-up mode.

Since the data retention and the data scan are performed by the data retention and scan latch 52 in two different modes (i.e., sleep mode and data scan mode), the data retention system employing the data retention and scan latch 52 can reduce the size of the circuit (e.g., the number of the transistors) so as to improve the integration density of the circuit.

Having described preferred embodiments of data retention system according to the present invention, modifications and variations can be readily made by those skilled in the art in light of the above teachings. It is therefore to be understood that, within the scope of the appended claims, the present invention can be practiced in a manner other than as specifically described herein.

What is claimed is:

1. A data retention system having master and slave latches for holding data in an active mode, the data retention system comprising:

a data retention latch for preserving data read from the master latch in a sleep mode, the data retention latch being connected to the master latch in parallel with the slave latch;

a first multiplexer for receiving data externally provided and feedback data from the data retention latch, the first multiplexer selectively outputting either the data externally provided or the feedback data to the master latch in response to a first control signal; and a second multiplexer for transferring output data of the master latch to the slave latch and the data retention latch in response to a second control signal.

2. The data retention system of claim 1, wherein the data retention latch receives a supply voltage in the sleep mode, and the data retention system except for the data retention latch receives no supply voltage in the sleep mode.

3. The data retention system of claim 2, wherein the first and second control signals turn off power for the master and slave latches, respectively, in the sleep mode.

4. The data retention system of claim 1, wherein the data retention latch is a nonvolatile data storage means.

5. The data retention system of claim 4, wherein the nonvolatile data storage means is an electrically erasable and programmable read-only memory (EEPROM).

6. The data retention system of claim 1, wherein the data retention latch inputs and outputs data through a dual rail for carrying true and complementary signals.

7. The data retention system of claim 6, wherein the true signal is transferred to the slave latch and the complementary signal is transferred to the data retention latch in the active mode, and the true and complementary signals are transferred to the data retention latch in the sleep mode.

8. The data retention system of claim 7, wherein the second multiplexer multiplexes true and complementary data lines carrying the true and complementary signals, respectively, in response to the second control signal.

9. The data retention system of claim 1, wherein the data retention latch includes:

at least one gate transistor gated by the second control signal; and a data holding unit having transistors for holding data transferred through the at least one gate transistor, wherein the at least one gate transistor and the transistors in the data holding unit have a high-threshold voltage.

10. The data retention system of claim 9, wherein the at least one gate transistor is turned on in the active mode and turned off in the sleep mode by the second control signal.

11. The data retention system of claim 9, wherein the data retention latch further includes first and second transistors connected between the at least one gate transistor and the data holding unit, wherein the first and second transistors are controlled by signals of true and complementary data lines, respectively, of a dual rail through which true and complementary signals are transferred to the data retention latch.

12. The data retention system of claim 11, wherein the data holding unit is connected with the dual rail through which the data preserved in the data holding unit is transferred to the master latch when the data retention system becomes in the active mode.

13. The data retention system of claim 11, wherein the at least one gate transistor includes two gate transistors connected to the first and second transistors, respectively.

14. A data retention system having master and slave latches for holding data in an active mode, the data retention system comprising:

a data retention and scan latch for preserving data read from the master latch in a sleep mode and for scanning data in the master latch in a testing mode, wherein the data retention and scan latch is connected to the master latch in parallel with the slave latch;

a first multiplexer for receiving data externally provided and feedback data from the data retention and scan latch, the first multiplexer selectively outputting either the data externally provided or the feedback data to the master latch in response to a first control signal; and a second multiplexer for transferring output data of the master latch to the slave latch and the data retention and scan latch in response to a second control signal.

15. The data retention system of claim 14, wherein power for the data retention and scan latch remains turned on in the sleep mode, and power for the data retention system except for the data retention and scan latch is turned off in the sleep mode.

16. The data retention system of claim 14, further including:

a first multiplexer for receiving data externally provided and feedback data from the data retention and scan latch, the first multiplexer selectively outputting either the data externally provided or the feedback data to the master latch in response to a first control signal; and second multiplexer for transferring output data of the master latch to the slave latch and the data retention and scan latch in response to a second control signal.

17. The data retention system of claim 14, wherein the data retention and scan latch inputs and outputs data through a dual rail for carrying true and complementary signals.

18. The data retention system of claim 17, wherein the second multiplexer multiplexes true and complementary data lines of the dual rail in response to the second control signal such that the true signal is transferred to the slave latch and the complementary signal is transferred to the data retention and scan latch in the active mode, and the true and complementary signals are transferred to the data retention and scan latch in the sleep mode.

* * * * *